United States Patent [19]

Mizoguchi et al.

[11] Patent Number: 5,773,536
[45] Date of Patent: Jun. 30, 1998

[54] RESIN COMPOSITION TO BE PLATED

[75] Inventors: Takashi Mizoguchi; Masatoshi Iwafune, both of Satte, Japan

[73] Assignees: Cosmo Research Institute; Cosmo Oil Co., Ltd., both of Tokyo, Japan

[21] Appl. No.: 814,336

[22] Filed: Mar. 11, 1997

Related U.S. Application Data

[63] Continuation of Ser. No. 618,714, Mar. 20, 1996, abandoned.

[30] Foreign Application Priority Data

Mar. 29, 1995 [JP] Japan ................................. 7-096140
Nov. 17, 1995 [JP] Japan ................................. 7-323602

[51] Int. Cl.$^6$ ................................. B05D 3/10; C25D 5/56
[52] U.S. Cl. ................................. 427/307; 427/309; 205/164; 428/425.8; 521/61; 521/62; 521/63
[58] Field of Search ................................. 427/307, 309, 427/532; 521/61, 62, 63; 205/164

[56] References Cited

U.S. PATENT DOCUMENTS

| | | | |
|---|---|---|---|
| 4,325,992 | 4/1982 | Donovan | 427/307 |
| 4,431,779 | 2/1984 | White et al. | 525/397 |
| 4,873,287 | 10/1989 | Holub et al. | 525/92 B |
| 4,942,206 | 7/1990 | White et al. | 525/92 A |
| 5,475,040 | 12/1995 | Jamison et al. | 525/130 |
| 5,492,586 | 2/1996 | Gorczyca | 156/245 |
| 5,502,098 | 3/1996 | Watanabe et al. | 524/404 |
| 5,530,047 | 6/1996 | Watanabe et al. | 525/133 |

FOREIGN PATENT DOCUMENTS

| | | |
|---|---|---|
| 44 22 652 | 1/1995 | Germany . |
| 024536 | 3/1978 | Japan . |
| 201604 | 9/1987 | Japan . |
| 050246 | 2/1992 | Japan . |

OTHER PUBLICATIONS

Database WPI, Derwent Publications, AN 93–261809, JP–A–05–179100, Jul. 20, 1993.
Database WPI, Derwent Publications, AN–95–128602, JP–A–07–053914, Feb. 28, 1995.

*Primary Examiner*—David Buttner
*Attorney, Agent, or Firm*—Oblon, Spivak, McClelland, Maier & Neustadt, P.C.

[57] ABSTRACT

A structure of a microporous resin bonded to metal is prepared by a method, comprising, molding a resin composition comprising a polymer alloy consisting of polyether imide and polyphenylene ether and particles of aluminum borate or amorphous silica filler, wherein the particles of aluminum borate and amorphous silica have an aspect ratio of 10 or less and an average diameter of 0.01–100 μm, the aluminum borate having the formula: $nAl_2O_3 \cdot mB_2O_3$, wherein n and m individually represent an integer of 1–100, and the amorphous silica having the formula: $SiO_2$, into a shaped object, treating the molded resin composition with an aqueous alkaline solution to remove the filler, thereby creating micropores within the resin object, and depositing a metal film on a surface of the treated resin object.

6 Claims, No Drawings

RESIN COMPOSITION TO BE PLATED

This application is a continuation of application Ser. No. 08/618,714, filed on Mar. 20, 1996, now abandoned.

BACKGROUND OF THE INVENTION

1. Field of the Invention

The present invention relates to a resin composition which can be plated. The resin composition has superior plating characteristics and excellent electrical characteristics, and is particularly useful as a material for electric or electronic parts such as printed circuit boards, wiring circuit boards, connectors, housing, and insulators. More particularly, because the resin composition of the present invention is thermoplastic and has excellent plating and electrical characteristics, it is suitable as a material for manufacturing three dimensional circuit boards, molded interconnection devices (MID), and molded circuit boards (MCB) using injection molding techniques.

2. Discussion of the Background

Because thermoplastic resin compositions having superior plating characteristics can be easily processed by injection molding or extrusion molding into three dimensional articles, such compositions are abundantly used for various electric or electronic parts, automobile parts, mechanical parts, and ornamental articles.

Conventional resin compositions capable of being plated exhibit adequate plating characteristics due to improvements in the shape and size of fillers which are added to such compositions and development in the plating technology. In addition to the excellent plating characteristics thermoplastic resins used for electronic parts, such as printed circuit boards, wiring circuit boards, connectors, housing, and insulators, must have excellent electrical characteristics.

Here, the plating characteristics indicate the capability of connecting the plated resin composition and the plating metal, that is, the adhesion between the resin composition and the metal plating film. Excellent resin-metal adhesion means excellent plating characteristics. Excellent electrical characteristics, on the other hand, are characteristics required for an insulating resin material, particularly a high frequency insulating resin material. Specifically, a material having excellent electrical characteristics must have a low dielectric constant ($\epsilon$) and a low dielectric loss tangent (tan $\delta$).

However, conventional resins and resin compositions to be plated have a high dielectric constant and a high dielectric loss tangent. For example, resins to be plated disclosed in Japanese Patent Application Laid-open Nos. 136841/1981, 230276/1993, and 98637/1989 have excellent plating characteristics and possess an extremely high value industrially. However, because of their poor electrical characteristics, application of these resins must be limited. For example, it is difficult to use these resins for electronic parts used in the high frequency wave region due to a large signal loss.

On the other hand, the adhesion strength between a molded resin and a metal plating film is largely affected by the physical characteristics of the resin surface, that is, roughness of the resin surface. In particular, the plating adhesion strength is remarkably improved by forming uniformly small anchoring pores (hereinafter called "micropores"). This is called the anchoring effect.

In many cases, a chemical etching process using an acid, an alkali, or an organic solvent is used for forming micropores on the surface of molded resins. Such micropores can be easily formed by a chemical etching process which comprises, for example, manufacturing molded articles from a resin composition comprising a prescribed amount of inorganic filler which is soluble in an acid, an alkali, or an organic solvent and immersing the molded resin surface in a specific solvent (the acid, alkali, or organic solvent) to cause the inorganic filler to dissolve out and be removed.

In this manner a resin composition comprising a thermoplastic resin and a specific inorganic filler which is soluble in an acid, an alkali, or an organic solvent has been conventionally used as the resin composition to be plated. Various fillers, such as calcium carbonate, glass, magnesium carbonate, magnesium oxide, calcium pyrophosphate, barium sulfate, barium carbonate, and zinc oxide, are used as the inorganic filler. These conventional inorganic fillers, however, impair the electrical characteristics of the resins, for example, by increasing the dielectric constant or the dielectric loss tangent. The increase in the dielectric constant or the dielectric loss tangent causes the signal loss to increase or delays the signal transmission speed, particularly when the product is used as an insulating material for electronic parts, inter alia, electronic parts for high frequency wave signals.

Here, the high frequency signals are signals of a frequency in the range of 1 GHz or larger. Specific equipment using high frequency signals includes cellular phones, PHS, pocket bells, satellite terminals, navigation systems, wireless LANs, and the like.

Conventionally, there has been no report disclosing resin compositions having both excellent plating characteristics and excellent electrical characteristics (low dielectric constant and low dielectric loss tangent).

Because of miniaturization and high integration of electronic parts in recent years, great attention is given to the technologies for manufacturing electronic parts by injection molding which is suitable for molding small and integrated parts.

An object of the present invention is therefore to provide a thermoplastic resin composition for plating, suitable for injection molding and having both excellent plating characteristics and excellent electrical characteristics.

In view of this situation the present inventors have conducted extensive studies and found that the addition of a specific inorganic filler to a thermoplastic resin produces a resin composition exhibiting both excellent plating characteristics and excellent electrical characteristics.

SUMMARY OF THE INVENTION

Accordingly, a specific object of the present invention is to provide a resin composition exhibiting both excellent plating characteristics and excellent electrical characteristics comprising a thermoplastic resin and aluminum borate or amorphous silica, or both.

Other objects, features and advantages of the invention will hereinafter become more readily apparent from the following description.

DETAILED DESCRIPTION OF THE PREFERRED EMBODIMENTS

Aluminum borate and amorphous silica used in the present invention have aspect ratios of 10 or smaller, preferably 5 or smaller, and an average particle diameter of 0.01–100 $\mu$m The resin composition of the present invention preferably has a dielectric constant of 4.0 or smaller and a dielectric loss tangent of 0.01 or smaller in the high frequency region of 100 KHz to 300 GHz.

Resins represented by commercially available thermoplastic resins are used as the thermoplastic resins of the present invention. Specific examples of such thermoplastic resins include general purpose resins, such as polyethylene (PE), polypropylene (PP), polystyrene (PS), polymethyl methacrylate (PMMA), ABS resin, and AS resins; engineering plastics, such as polyacetate (POM), polycarbonate (PC), polyphenylene ether (PPE), polyamide (PA: nylon), polyethylene terephthalate (PET), and polybutylene terephthalate (PBT); and other thermoplastic resins such as polyphenylene sulfide (PPS), polyether sulfone (PES), polyether imide (PEI), polyether ether ketone (PEEK), polyketone (PK), polyimide (PI), polycyclohexanedimethanol terephthalate (PCT), polyallylate (PAR), and various liquid crystal polymers (LCP).

These resins may be used individually or may be used as a polymer alloy or a polymer blend which is a multicomponent polymer system consisting of two or more of these resins chemically or physically blended in prescribed proportions. A denatured product of these resins can also be used. The denatured product here means a synthetic resin or a mixture of synthetic resins, of which a part of the basic component is replaced by another component when the resins are reacted or compounded.

Given as preferred combinations of resins in multicomponent polymer systems are, as binary systems, PPE/PS, PPE/PC, PPE/PA, PPE/PET, PPE/PBT, PPE/PEI, PPE/PPS, PPE/PES, PPE/PEEK, PPE/PCT, PPE/LCP, PEI/PC, PEI/PEEK, PEI/LCP, PEI/PET, PEI/PBT, LCP/PAR, LCP/PEEK, LCP/PET, LCP/PBT, LCP/PC, LCP/PCT, and LCP/PEEK, and as ternary systems, PPE/PC/PS, PPE/PEI/PC, PPE/PEI/PS, PEI/PPE/LCP, PEI/PC/LCP, PEI/PEEK/LCP, and the like.

A compatibilizer or the like may be added to these polymer alloys or polymer blends to improve compatibility among the polymers. Given as examples of specific compatibilizers which can be used are copolymers of epoxy-modified-MMA and MMA; copolymers of epoxy-modified-St and St; copolymers of epoxy-modified-St and MMA; copolymers of epoxy-modified-MMA and St; copolymers of St and maleic anhydride; copolymers of St and MMA; and copolymers of maleic anhydride and vinyl compound. These copolymers may be random copolymers, block copolymers, alternating copolymers, or graft copolymers.

The thermoplastic resin used in the present invention may contain various additives which may improve the basic characteristics of the resins, such as mechanical characteristics, electrical characteristics, heat resistance, molding processability, fluidity, flame retarding characteristics, UV resistance, chemical resistance, and outward appearance of the molded products, and to provide a color or glossiness to the products. Plasticizers, thermal stabilizers, oxidation stabilizers, cross-linking agents, flame retardants, UV absorbers, coloring agents, glossing agents, and the like are given as examples of specific additives.

The inorganic fillers used in the present invention which are aluminum borate and amorphous silica are respectively shown by the following formulas:

$$nAl_2O_3 \cdot mB_2O_3 \qquad (1)$$

wherein n and m individually represent an integer of 1–100, and

$$SiO_2 \qquad (2)$$

Aluminum borate is industrially manufactured from $Al_2O_3$ and $B_2O_3$ by a method called an external flux process.

The amorphous silica is preferably that containing 96% or more, preferably 99% or more, of silicon oxide ($SiO_2$). Such an amorphous silica is manufactured, for example, by melting quartz (crystalline silica) and cooling the molten silica. The dielectric constant and dielectric loss tangent are high if the amount of silicon oxide in the amorphous silica is less than 96%.

The aluminum borate and amorphous silica used in the present invention are powdery or globular fillers having an aspect ratio, which is the ratio of the length along the long axis to the length along the short axis, of 10 or less, preferably 5 or less, and an average diameter of 0.01–100 $\mu$m, preferably 0.1–50 $\mu$m. The closer the aspect ratio to 1, that is, the closer the shape of the filler to a sphere, the greater the degree of improvement in the plating characteristics. If the aspect ratio is too large, specifically larger than 10, the shape of the micropores is fibrous, remarkably decreasing the plate adhesion strength. If the average particle diameter is less than 0.01 $\mu$m, it is difficult for the catalysts for non-electrolytic plating to adhere to the surface of the molded product. This results not only in insufficient adhesion strength, but also uneven plating. If the average particle diameter is larger than 100 $\mu$m, the micropores are too large to provide sufficient anchoring. As a result, only weak physical bonding is obtained between the plated film and the resin.

The amount of the inorganic filler, that is, aluminum borate or amorphous silica, is 5–70 parts by weight, preferably 10–60parts by weight, for 100 parts by weight of the total amount of the thermoplastic resin and the inorganic filler. If the amount of the inorganic filler is less than 5 parts by weight, sufficient plating adhesion strength cannot be obtained; if larger than 70 parts by weight, the fluidity of the resulting resin composition is remarkably lowered and molding processability is impaired.

In order to improve dispersibility and affinity to the resin, thermal stability and oxidation stability, the inorganic fillers used in the present invention may be surface-treated by a conventional method.

The addition of a coupling agent is given as an example of the method of surface treatment. Given as examples of coupling agents which can be preferably used are silane coupling agents, such as vinyltrichlorosilane, vinyltris($\beta$-methoxyethoxy)silane, vinyltriethoxysilane, vinyltrimethoxysilane, $\gamma$-methacryloxypropyltrimethoxysilane, $\beta$-(3,4-epoxycyclohexyl)ethyltrimethoxysilane, $\gamma$-glycidoxypropyltrimethoxysilane, $\gamma$-glycidoxypropylmethyldiethoxysilane, N-$\beta$-(aminoethyl)-$\gamma$-aminopropyltrimethoxysilane, N-$\beta$-(aminoethyl)-$\gamma$-aminopropylmethyldimethoxysilane, $\gamma$-aminopropyltriethoxysilane, N-phenyl-$\gamma$-aminopropyltrimethoxysilane, $\gamma$-mercaptopropyltrimethoxysilane, $\gamma$-chloropropyltrimethoxysilane, di(3-triethoxysilylpropyl)tetrasulfide, 3-mercaptopropyltrimethoxysilane, 2-mercaptoethyltrimethoxysilane, 3-aminopropyltriethoxysilane, N-2(aminoethyl)-3-aminopropyltrimethoxysilane, vinyltri(2-methoxyethoxy) silane, 3-methacryloyloxypropyltrimethoxysilane, and 3-glycidyloxypropyltrimethoxysilane; and titanate coupling agents, such as triisostearoylisopropyl titanate, di(dioctylphosphate)diisopropyl titanate, didodecylbenzenesulfonyldiisopropyl titanate, and diisostearyldiisopropyl titanate.

These coupling agents can be used in an amount which does not impair the electrical characteristics or plating characteristics, usually in an amount of 0.0001–1 part by weight for 100 parts by weight of the inorganic filler.

Aluminum borate and amorphous silica which are incorporated in a thermoplastic resin as an inorganic filler in the resin composition of the present invention may be used either individually or in combination.

Further, it is possible to use inorganic fillers other than aluminum borate and amorphous silica to an extent which does not impair the electrical characteristics and plating characteristics. Given as examples of such other inorganic fillers which can be used together are glass, glass single fiber, glass fiber, glass balloons, shirasu balloons, chopped strands, carbon fiber, carbon, carbon black, alamide, potassium titanate, magnesium borate, calcium carbonate, magnesium carbonate, magnesium sulfate, calcium sulfate, aluminum sulfate, pyrophosphate, silicon nitride, aluminum nitride, boron nitride, silicon carbide, alumina, alumina fiber, silica, mica, talc, diatomaceous earth, clay, volcanic ash, limestone, bentonite, titanium oxide, magnesium oxide, calcium oxide, molybdenum disulfide, and the like.

The resin composition of the present invention can be manufactured by a conventional process for manufacturing common composite materials. Industrially, a melt-kneading method is preferred in view of productivity and economy. Specific examples of such methods include a kneading method using a biaxial or uniaxial extruder, and a method using a batch-type heating melt-kneader which is typified by the laboplast mill.

Because the resin composition of the present invention is thermoplastic, injection molding or extrusion molding can be used for manufacturing molded products from the resin composition. Films or membranes can also be manufactured by a solvent cast method using an organic solvent or the like.

In the same way as in the case of conventional resin compositions for plating, the strength of adhesion between the molded products made from the resin composition of the present invention and the plating metal film (the plating adhesion strength) depends on the physical characteristics of the molded surface of the resin composition, specifically the roughness of the molded resin surface. It is possible to remarkably improve the plating adhesion strength from the anchoring effect obtained by forming uniform micropores of an appropriate size on the surface of the molded article before plating.

In the same manner as in the case of molded products made from conventional resin compositions for plating, chemical etching is effective for producing the micropores. As mentioned above, the chemical etching can be carried out by immersing the molded resin surface in an acid, alkali, or organic solvent, or the like and dissolving and removing the inorganic filler from the surface of the molded article.

Because aluminum borate and amorphous silica used in the present invention is soluble in alkaline aqueous solutions, it is possible to dissolve aluminum borate or amorphous silica and remove these from the surface of molded articles by chemically etching that surface with an alkaline aqueous solution, thereby producing micropores which are effective for plating. As the alkaline aqueous solution, aqueous solutions of sodium hydroxide, potassium hydroxide, lithium hydroxide, and the like are preferred in view of the solubility of aluminum borate and amorphous silica, and also in view of economy. These alkaline aqueous solution may be used either individually or mixed. The preferred concentration of the alkaline aqueous solution is in the range of 1N to 15N, and particularly in the range of 3N to 12N. If the alkali concentration is too small, it takes a long time for the aluminum borate or amorphous silica to dissolve out; if the concentration is too high, the resin may exhibit conspicuous deterioration, resulting in a decrease in the plating adhesion strength.

In the case where inorganic fillers other than aluminum borate or amorphous silica are used, these other inorganic fillers may be chemically etched together with aluminum borate and amorphous silica. In this case, the etching solution is selected taking into consideration the characteristics (e.g., the solubility, corrosivity, etc.) of such other inorganic fillers. For instance, when calcium carbonate, pyrophosphate, or barium sulfate is used together with aluminum borate or amorphous silica, an acid, such as sulfuric acid, hydrochloric acid, chromic acid, phosphoric acid, acetic acid, or boric acid, a mixture of two or more of these acids, or aqueous solution of one or more of these acid can be used. When glass-type or alumina-type fillers are used together, an alkali, such as an aqueous solution of potassium hydroxide, sodium hydroxide, or lithium hydroxide, or mixture of these, at any optional concentration, can be used.

In any of the above cases, the chemical etching is carried out at room temperature (20° C.) to 120° C., preferably at a temperature of 50° C. to 100° C. If the etching temperature is too low, it takes a long time for the inorganic fillers to dissolve out; if too high, deterioration of the resin is conspicuous.

To improve the rate of dissolution of the inorganic fillers it is possible to agitate the mixture, irradiate the mixture with ultrasonic waves, or bubble air through the mixture, during the chemical etching.

In addition, to carry out the chemical etching more effectively a procedure called pre-etching, which consists of exposing the inorganic fillers by dissolving the resin on the surface of molded article (a skin layer of resin), may be applied. Conventional methods of pre-etching can be used. Among organic solvents, alkaline solutions, and acids commonly used for pre-etching, organic solvents or acids are particularly preferred in the present invention. Preferred organic solvents used for pre-etching are, for example, chloroform, dichloromethane, benzene, toluene, xylene, pyridine, hexane, tetrahydrofuran, acetonitrile, ethyl acetate, N,N-dimethylformamide, N-methylpyrrolidone, and dimethylsulfoxide. Sulfuric acid, hydrochloric acid, chromic acid, nitric acid, or phosphoric acid, or mixtures of these are given as preferred examples of the acids.

Except for the chemical etching step and the pre-etching step, the molded products produced from the resin composition of the present invention may be plated by non-electrolyte plating or electrolytic plating in the same manner as in conventional resin compositions for plating.

As previously mentioned, the resin composition of the present invention preferably has a dielectric constant of 4.0 or less and a dielectric loss tangent of 0.01 or less in the high frequency region of 100 KHz to 300 GHz. Resin compositions having a dielectric constant greater than 4.0 or a dielectric loss tangent greater than 0.01 in the above frequency region may unduly increase signal loss when used as an insulating material for electronic parts, particularly the electronic parts or materials used in a high frequency region of 1 GHz or greater, making it difficult to reasonably design circuits and the like. Such parts or materials are unusable in some on applications.

Other features of the invention will become apparent in the course of the following description of the exemplary embodiments which are given for illustration of the invention and are not intended to be limiting thereof.

EXAMPLES

The aluminum borate used in the examples and comparative examples hereinbelow consists of rhombic system crystals having a chemical formula of $9Al_2O_3 \cdot 2B_2O_3$, and made from $Al_2O_3$ and $B_2O_3$ by the external flux method.

Amorphous silica used in the examples and comparative examples was made by melting quartz (crystalline silica) with an $SiO_2$ purity of 99.9% or more, and cooling the molten silica.

The following resins were used in the examples and comparative examples.

PEI: Polyether imide, Ultem 1000™, manufactured by GE Plastics Japan Ltd.
PPE: Denatured polyphenylene ether, XYRON PXL X9102™, manufactured by Asahi Chemical Industry Co., Ltd.
LCP: Liquid crystal polymer, SUMIKASUPER LCP E6000™, manufactured by Sumitomo Chemical Co., Ltd.
PA: Nylon 6, NOVAMID 1013C™, manufactured by Mitsubishi Chemical Corp.
POM: Polyacetate, Tenac 3010™, manufactured by Asahi Chemical Industry Co., Ltd.
PBT: Polybutylene terephthalate, Teijin PBT CN-7000™, manufactured by Teijin Co.
PEEK: Polyether ether ketone, VICTREX 45G™, manufactured by Sumitomo Chemical Co., Ltd.
PPS: Polyphenylene sulfide, Lightone R-4™, manufactured by Dainippon ink and chemicals, Inc.
PC: Polycarbonate, NOVAREX 7022A™, manufactured by Mitsubishi Chemical Corp.

EXAMPLES 1–54

<Preparation of resin compositions to be plated>

Thermoplastics, aluminum borate, and amorphous silica were pre-blended in the proportions shown in Tables 1-1 to 1-4. The mixture was fed into a biaxial extruder (ZE40A™, manufactured by Hermann Berstorff Maschinenban GmbH) using a quantitative feeder at a rate of 20–60 kg/hour, and melt-kneaded at the temperatures and rotations shown in Tables 2-1 to 2-4. After cooling, the strands were cut by a pelletizer to produce pellets.

<Molding>

The pellets were dried at 100°–150° C. in a thermostat and molded by an injection molding machine (F-85™, manufactured by Klockner Ferromatik Desma GmbH) at the molding temperatures shown in Tables 2-1 to 2-4 to prepare test leaves for the evaluation of plating characteristics and electrical characteristics. The shapes of the test leaves were as follows.

<Shapes of test leaves>

ASTM #1 Dumbbell: for the evaluation of plating characteristics

Disc 1, φ 100 mm×1.6 mm: for the evaluation of electrical characteristics in the frequency range of 1–15 MHz Disc 2, φ 100 mm×0.8 mm: for the evaluation of electrical characteristics in the frequency range of 1–25 GHz <Plating>

The above test leaves were de-fatted by treating with Ace Clean A220™ manufactured by Okuno Chemical Industries Co., Ltd. at 60° C. for 5 minutes and washed with water. The flat surface of the test leaves was chemically etched under the conditions shown in Tables 3-1 to 3-4 or Table 8. After chemical etching, the test leaves were neutralized with 5 g/l NaOH aqueous solution or 5 ml/l HCl aqueous solution at 25° C. for 3 minutes followed by washing with water, conditioned with 150 ml/l of Condilizer SP™ manufactured by Okuno Chemical Industries Co., Ltd. at 50° C. for 4 minutes followed by washing with water. The test leaves were then catalyzed with 60 ml/l of Catalyst C™ manufactured by Okuno Chemical Industries Co., Ltd. and 150 ml/l HCl at room temperature for 4 minutes, followed by washing with water, and activated with 5 wt % HCl acqueous solution at 25° C. for two minutes. After washing with diluted $H_2SO_4$, the test leaves were non-electrolytically plated in OPC-750™ manufactured by Okuno Chemical Industries Co., Ltd. using 100 ml/l of A solution, 100 ml/l of B solution, and 2 ml/l of C solution, followed, after washing with diluted $H_2SO_4$, by electroplating (copper plate, thickness: 40 µm) in a copper sulfate bath (120–250 g/l of $CuSO_4 \cdot 5H_2O$; 30–100 g/l of $H_2SO_4$; 20–80 mg/l of $Cl^-$ ion) under the conditions of the electric current density of 1–20 $A/dm^2$, the bath voltage of 1–5 V and the source voltage of 6–8 V.

<Evaluation of plating characteristics>

Evaluation of surface conditions after chemical etching

The test leaves (ASTM #1 Dumbbell) were dried after chemical etching. A cellophane tape (width: 18 mm, manufactured by Nichiban Co., Ltd.) was attached to the chemically etched surface and pressed (pressure: about 500 g) to attach the tape to the surface of the test leaf. The tape was then peeled off uninterruptedly at an angle of 90° to evaluate the peelability of the surface layer by macroscopic observation. The results are classified as follows:

◎ There was no release of resin from the surface whatsoever.

○ There was almost no release of resin from the surface.

Δ Part of the surface resin was released.

X The resin surface was attached to the tape and released with the tape.

Evaluation of external appearance of plated surface

After electroplating, the external appearance of the plated surface (uniformity of plated film, presence or absence of plating swelling) was macroscopically observed according to the following criteria.

(Uniformity of plated film)

◎ The surface was uniform and mirror-like

○ The surface was uniform and almost mirror-like.

Δ Part of the surface was not uniform.

X The surface was not uniform as a whole.

(Swelling of plated film)

◎ There was no swelling of the plated film whatsoever.

○ There was almost no swelling of the plated film.

Δ Part of the plated film exhibited swelling.

X Complete swelling of the plated film was observed.

Measurement of plate film adhesion strength

After electroplating, a stripe 1 cm in width was cut out with a cutter knife. The tip of the strip was pulled upward at 90° and this tip was attached to a spring to measure the strength required to release the plated film (kg/cm).

<Evaluation of electrical characteristics>

Measurement of dielectric constant and dielectric loss tangent

Measured wave length: 1 MHz, 10 MHz, 1 GHz, 10 GHz, 20 GHz

Measurement temperature: 25° C.

Measuring method:
 (1) Parallel plate electrode method (1–15 MHz)
 (2) Triplate line resonator method (Loss separation method; 1–25 GHz)

The results of evaluation of peelability of the surface layer and plating characteristics after chemical etching are shown in Tables 3-1 to 3-4. The results of evaluation of the electrical characteristics are shown in Tables 4-1 to 4-4.

TABLE 1-1

| Example No. | Resin Types | Resin Amount (wt %) | Inorganic Filler (Aluminum borate) Amount (wt %) | Average Diameter (μm) | Aspect Ratio (Average) |
|---|---|---|---|---|---|
| 1 | PEI | 80 | 20 | 2.5 | 1.5 |
| 2 | PEI | 60 | 40 | 2.5 | 1.5 |
| 3 | PEI | 50 | 50 | 2.5 | 1.5 |
| 4 | PEI | 50 | 50 | 4.0 | 1.5 |
| 5 | PEI | 50 | 50 | 7.0 | 1.5 |
| 6 | PEI | 50 | 50 | 8.0 | 1.4 |
| 7 | PEI | 50 | 50 | 8.0 | 3.0 |
| 8 | PEI | 50 | 50 | 8.0 | 5.5 |
| 9 | PEI | 50 | 50 | 8.0 | 8.5 |
| 10 | PEI | 50 | 50 | 30.0 | 1.5 |
| 11 | PPE | 50 | 50 | 2.5 | 1.5 |
| 12 | POM | 50 | 50 | 2.5 | 1.5 |
| 13 | PA | 50 | 50 | 2.5 | 1.5 |
| 14 | PBT | 50 | 50 | 2.5 | 1.5 |
| 15 | PEEK | 50 | 50 | 2.5 | 1.5 |
| 16 | PPS | 50 | 50 | 2.5 | 1.5 |
| 17 | LCP | 50 | 50 | 2.5 | 1.5 |

TABLE 1-2

| Example No. | Resin Types | Resin Amount (wt %) | Inorganic Filler (Amorphous silica) Amount (wt %) | Average Diameter (μm) | Aspect Ratio (Average) |
|---|---|---|---|---|---|
| 18 | PEI | 80 | 20 | 5.2 | 1.4 |
| 19 | PEI | 70 | 30 | 5.2 | 1.4 |
| 20 | PEI | 60 | 40 | 5.2 | 1.4 |
| 21 | PEI | 40 | 60 | 5.2 | 1.4 |
| 22 | PEI | 60 | 40 | 3.1 | 1.5 |
| 23 | PEI | 60 | 40 | 1.2 | 1.3 |
| 24 | PEI | 60 | 40 | 7.9 | 1.4 |
| 25 | PEI | 60 | 40 | 27.0 | 1.3 |
| 26 | PEI | 60 | 40 | 3.1 | 3.0 |
| 27 | PEI | 60 | 40 | 3.1 | 7.8 |
| 28 | PPE | 60 | 40 | 5.2 | 1.4 |
| 29 | POM | 60 | 40 | 5.2 | 1.4 |
| 30 | PA | 60 | 40 | 5.2 | 1.4 |
| 31 | PBT | 60 | 40 | 5.2 | 1.4 |
| 32 | PEEK | 60 | 40 | 5.2 | 1.4 |
| 33 | PPS | 60 | 40 | 5.2 | 1.4 |
| 34 | LCP | 60 | 40 | 5.2 | 1.4 |
| 35 | PPE | 60 | 40 | 0.1 | 1.6 |
| 36 | PPE | 60 | 40 | 50 | 1.2 |
| 37 | PPE | 36 | 70 | 5.2 | 1.4 |
| 38 | PPE | 90 | 10 | 5.2 | 1.4 |
| 39 | PPE | 95 | 5 | 5.2 | 1.4 |

TABLE 1-3

| Example No. | Resin Types | Resin Amount (wt %) | Inorganic Filler (Aluminum borate) Amount (wt %) | Average Diameter (μm) | Aspect Ratio (Average) |
|---|---|---|---|---|---|
| 40 | PEI/PPE | 25/25 | 50 | 8.0 | 1.4 |
| 41 | PEI/PPE | 30/20 | 50 | 8.0 | 1.4 |
| 42 | PEI/PPE/LCP | 20/20/10 | 50 | 8.0 | 1.4 |
| 43 | PA/PPE | 25/25 | 50 | 8.0 | 1.4 |

TABLE 1-4

| Example No. | Resin Types | Resin Amount (wt %) | Inorganic Filler (Amorphous silica) Amount (wt %) | Average Diameter (μm) | Aspect Ratio (Average) |
|---|---|---|---|---|---|
| 44 | PEI/PPE | 25/25 | 50 | 5.2 | 1.4 |
| 45 | PEI/PPE | 30/20 | 50 | 5.2 | 1.4 |
| 46 | PEI/PPE | 20/30 | 50 | 5.2 | 1.4 |
| 47 | PEI/PPE/LCP | 20/20/10 | 50 | 5.2 | 1.4 |
| 48 | PPE/PA | 25/25 | 50 | 5.2 | 1.4 |
| 49 | PPE/PC | 25/25 | 50 | 5.2 | 1.4 |
| 50 | PEI/PC | 30/20 | 50 | 5.2 | 1.4 |
| 51*[1] | PEI/PPE | 18/42 | 40 | 5.2 | 1.4 |
| 52*[2] | PEI/PPE | 18/42 | 40 | 5.2 | 1.4 |
| 53*[3] | PEI/PPE | 18/42 | 40 | 5.2 | 1.4 |
| 54*[4] | PEI/PPE | 18/42 | 20/20*[5] | 8.0/5.2*[6] | 1.4 |

*[1] 15 wt % of an epoxy denatured St-MMA copolymer was added as a compatibilizer for resins.
*[2] 1 wt % of titanium oxide was added as a coloring agent.
*[3] 0.001 wt % of γ-aminopropyltriethoxy silane was added as a silane coupling agent for amorphous silica.
*[4] A mixture of aluminum borate and amorphous silica was used as the inorganic filler.
*[5] Aluminum borate/amorphous silica
*[6] Aluminum borate/amorphous silica

TABLE 2-1

| Example No. | Kneading Conditions Temperature (°C.) | Rotation rpm | Injection Nozzle Temperature (°C.) |
|---|---|---|---|
| 1 | 300 | 100 | 340 |
| 2 | 300 | 100 | 350 |
| 3 | 300 | 100 | 360 |
| 4 | 300 | 100 | 360 |
| 5 | 300 | 100 | 360 |
| 6 | 300 | 100 | 360 |
| 7 | 300 | 100 | 360 |
| 8 | 300 | 100 | 360 |
| 9 | 300 | 100 | 360 |
| 10 | 300 | 100 | 340 |
| 11 | 280 | 150 | 300 |
| 12 | 220 | 150 | 220 |
| 13 | 250 | 150 | 250 |
| 14 | 370 | 120 | 250 |
| 15 | 330 | 100 | 380 |
| 16 | 320 | 100 | 340 |
| 17 | 300 | 100 | 340 |

TABLE 2-2

| Example No. | Kneading Conditions Temperature (°C.) | Rotation rpm | Injection Nozzle Temperature (°C.) |
|---|---|---|---|
| 18 | 300 | 150 | 310 |
| 19 | 300 | 150 | 310 |
| 20 | 300 | 150 | 320 |
| 21 | 300 | 150 | 340 |
| 22 | 300 | 150 | 320 |
| 23 | 300 | 150 | 320 |
| 24 | 300 | 150 | 320 |
| 25 | 300 | 150 | 320 |
| 26 | 300 | 150 | 320 |
| 27 | 300 | 150 | 320 |
| 28 | 260 | 150 | 290 |
| 29 | 210 | 150 | 220 |
| 30 | 250 | 150 | 260 |
| 31 | 240 | 150 | 260 |
| 32 | 350 | 150 | 390 |
| 33 | 320 | 150 | 340 |

TABLE 2-2-continued

| Example No. | Kneading Conditions Temperature (°C.) | Rotation rpm | Injection Nozzle Temperature (°C.) |
|---|---|---|---|
| 34 | 340 | 150 | 340 |
| 35 | 260 | 140 | 290 |
| 36 | 260 | 150 | 290 |
| 37 | 270 | 100 | 300 |
| 38 | 260 | 150 | 290 |
| 39 | 260 | 150 | 290 |

TABLE 2-3

| Example No. | Kneading Conditions Temperature (°C.) | Rotation rpm | Injection Nozzle Temperature (°C.) |
|---|---|---|---|
| 40 | 300 | 100 | 320 |
| 41 | 300 | 100 | 330 |
| 42 | 290 | 100 | 330 |
| 43 | 320 | 120 | 300 |

TABLE 2-4

| Example No. | Kneading Conditions Temperature (°C.) | Rotation rpm | Injection Nozzle Temperature (°C.) |
|---|---|---|---|
| 44 | 300 | 150 | 320 |
| 45 | 300 | 150 | 320 |
| 46 | 300 | 150 | 320 |
| 47 | 300 | 150 | 330 |
| 48 | 280 | 150 | 300 |
| 49 | 250 | 150 | 260 |
| 50 | 280 | 150 | 300 |
| 51 | 300 | 150 | 320 |
| 52 | 300 | 150 | 320 |
| 53 | 300 | 150 | 320 |
| 54 | 300 | 150 | 320 |

TABLE 3-1

| Example No. | Chemical Etching Conditions Soln. | Conc. | Temp. (°C.) | Time (min) | Surface Peel-ability | Evaluation of plated film Appearance Uniformity | Swelling | Adhesion (Kg/cm) |
|---|---|---|---|---|---|---|---|---|
| 1 | Acq. KOH | 8N | 95 | 120 | ○ | ⊙ | ⊙ | 1.21 |
| 2 | Acq. KOH | 8N | 95 | 120 | ⊙ | ⊙ | ⊙ | 1.44 |
| 3 | Acq. KOH | 8N | 95 | 120 | ⊙ | ⊙ | ⊙ | 1.85 |
| 4 | Acq. KOH | 8N | 95 | 120 | ⊙ | ⊙ | ⊙ | 1.70 |
| 5 | Acq. KOH | 8N | 95 | 120 | ⊙ | ⊙ | ⊙ | 1.71 |
| 6 | Acq. KOH | 8N | 95 | 120 | ⊙ | ⊙ | ⊙ | 1.66 |
| 7 | Acq. KOH | 8N | 95 | 120 | ⊙ | ⊙ | ⊙ | 1.51 |
| 8 | Acq. KOH | 8N | 95 | 120 | ⊙ | ⊙ | ⊙ | 1.50 |
| 9 | Acq. KOH | 8N | 95 | 120 | ⊙ | ⊙ | ⊙ | 1.42 |
| 10 | Acq. KOH | 8N | 95 | 120 | ⊙ | ⊙ | ⊙ | 1.50 |
| 11 | Acq. KOH | 8N | 80 | 90 | ⊙ | ⊙ | ⊙ | 1.89 |
| 12 | Acq. KOH | 8N | 80 | 90 | ⊙ | ⊙ | ⊙ | 1.77 |
| 13 | Acq. KOH | 8N | 80 | 90 | ⊙ | ⊙ | ⊙ | 1.74 |
| 14 | Acq. KOH | 8N | 80 | 60 | ○ | ⊙ | ⊙ | 1.44 |
| 15 | Acq. KOH | 8N | 95 | 120 | ⊙ | ⊙ | ⊙ | 1.80 |
| 16 | Acq. KOH | 8N | 95 | 120 | ⊙ | ⊙ | ⊙ | 1.56 |
| 17 | Acq. KOH | 8N | 80 | 60 | ○ | ⊙ | ⊙ | 1.63 |

TABLE 3-2

| Example No. | Chemical Etching Conditions Soln. | Conc. | Temp. (°C.) | Time (min) | Surface Peel-ability | Evaluation of plated film Appearance Uniformity | Swelling | Adhesion (Kg/cm) |
|---|---|---|---|---|---|---|---|---|
| 18 | Acq. KOH | 8N | 90 | 60 | ⊙ | ⊙ | ⊙ | 1.36 |
| 19 | Acq. KOH | 8N | 90 | 90 | ⊙ | ⊙ | ⊙ | 1.49 |
| 20 | Acq. KOH | 8N | 90 | 90 | ⊙ | ⊙ | ⊙ | 1.88 |
| 21 | Acq. KOH | 8N | 90 | 90 | ⊙ | ⊙ | ⊙ | 1.95 |
| 22 | Acq. KOH | 8N | 90 | 90 | ⊙ | ⊙ | ⊙ | 1.51 |
| 23 | Acq. KOH | 8N | 90 | 90 | ⊙ | ⊙ | ⊙ | 1.47 |
| 24 | Acq. KOH | 8N | 90 | 90 | ⊙ | ⊙ | ⊙ | 1.48 |
| 25 | Acq. KOH | 8N | 90 | 90 | ⊙ | ⊙ | ⊙ | 1.35 |
| 26 | Acq. KOH | 8N | 90 | 90 | ⊙ | ⊙ | ⊙ | 1.45 |
| 27 | Acq. KOH | 8N | 90 | 120 | ⊙ | ⊙ | ⊙ | 1.41 |
| 28 | Acq. KOH | 8N | 90 | 60 | ⊙ | ⊙ | ⊙ | 1.56 |
| 29 | Acq. KOH | 8N | 90 | 90 | ⊙ | ⊙ | ⊙ | 1.52 |

TABLE 3-2-continued

| Example No. | Chemical Etching Conditions Soln. | Conc. | Temp. (°C.) | Time (min) | Surface Peel-ability | Evaluation of plated film Appearance Uniformity | Swelling | Adhesion (Kg/cm) |
|---|---|---|---|---|---|---|---|---|
| 30 | Acq. KOH | 8N | 90 | 90 | ◎ | ◎ | ◎ | 1.47 |
| 31 | Acq. KOH | 8N | 90 | 90 | ◎ | ◎ | ◎ | 1.48 |
| 32 | Acq. KOH | 8N | 90 | 90 | ◎ | ◎ | ◎ | 1.72 |
| 33 | Acq. KOH | 8N | 90 | 90 | ◎ | ◎ | ◎ | 1.31 |
| 34 | Acq. KOH | 8N | 90 | 90 | ◎ | ◎ | ◎ | 1.57 |
| 35 | Acq. KOH | 8N | 90 | 90 | ◎ | ◎ | ◎ | 1.21 |
| 36 | Acq. KOH | 8N | 90 | 90 | ◎ | ◎ | ◎ | 1.78 |
| 37 | Acq. KOH | 8N | 90 | 90 | ◎ | ◎ | ◎ | 1.23 |
| 38 | Acq. KOH | 8N | 90 | 90 | ◎ | ◎ | ◎ | 1.10 |
| 39 | Acq. KOH | 8N | 90 | 90 | ○ | ○ | ○ | 1.02 |

TABLE 3-3

| Example No. | Chemical Etching Conditions Soln. | Conc. | Temp. (°C.) | Time (min) | Surface Peel-ability | Evaluation of plated film Appearance Uniformity | Swelling | Adhesion (Kg/cm) |
|---|---|---|---|---|---|---|---|---|
| 40 | Acq. KOH | 8N | 95 | 120 | ○ | ◎ | ◎ | 1.89 |
| 41 | Acq. KOH | 8N | 95 | 120 | ◎ | ◎ | ◎ | 1.89 |
| 42 | Acq. KOH | 8N | 80 | 90 | ◎ | ◎ | ◎ | 1.48 |
| 43 | Acq. KOH | 8N | 80 | 90 | ◎ | ◎ | ◎ | 1.41 |

TABLE 3-4

| Example No. | Chemical Etching Conditions Soln. | Conc. | Temp. (°C.) | Time (min) | Surface Peel-ability | Evaluation of plated film Appearance Uniformity | Swelling | Adhesion (Kg/cm) |
|---|---|---|---|---|---|---|---|---|
| 44 | Acq. KOH | 8N | 90 | 90 | ◎ | ◎ | ◎ | 1.71 |
| 45 | Acq. KOH | 8N | 90 | 90 | ◎ | ◎ | ◎ | 1.63 |
| 46 | Acq. KOH | 8N | 90 | 90 | ◎ | ◎ | ◎ | 1.69 |
| 47 | Acq. KOH | 8N | 90 | 90 | ◎ | ◎ | ◎ | 1.53 |
| 48 | Acq. KOH | 8N | 90 | 90 | ◎ | ◎ | ◎ | 1.41 |
| 49 | Acq. KOH | 8N | 90 | 90 | ◎ | ◎ | ◎ | 1.54 |
| 50 | Acq. KOH | 8N | 90 | 90 | ◎ | ◎ | ◎ | 1.63 |
| 51 | Acq. KOH | 8N | 90 | 90 | ◎ | ◎ | ◎ | 1.63 |
| 52 | Acq. KOH | 8N | 90 | 90 | ◎ | ◎ | ◎ | 1.65 |
| 53 | Acq. KOH | 8N | 90 | 90 | ◎ | ◎ | ◎ | 1.42 |
| 54 | Acq. KOH | 8N | 90 | 90 | ◎ | ◎ | ◎ | 1.77 |

TABLE 4-1

(Upper row: Dielectric constant
Lower row: Dielectric loss tangent)

| Example No. | 1 MHz | 10 MHz | 1 GHz | 10 GHz | 20 GHz |
|---|---|---|---|---|---|
| 1 | 3.25 | 3.24 | 3.15 | 3.14 | 3.12 |
|  | 0.004 | 0.004 | 0.005 | 0.006 | 0.007 |
| 2 | 3.30 | 3.30 | 3.29 | 3.24 | 3.22 |
|  | 0.004 | 0.005 | 0.007 | 0.007 | 0.007 |
| 3 | 3.31 | 3.30 | 3.30 | 3.26 | 3.24 |
|  | 0.005 | 0.005 | 0.006 | 0.007 | 0.007 |
| 4 | 3.31 | 3.29 | 3.29 | 3.28 | 3.26 |
|  | 0.005 | 0.006 | 0.007 | 0.007 | 0.008 |
| 5 | 3.30 | 3.30 | 3.28 | 3.28 | 3.26 |
|  | 0.004 | 0.004 | 0.006 | 0.007 | 0.007 |
| 6 | 3.30 | 3.29 | 3.28 | 3.28 | 3.27 |
|  | 0.006 | 0.006 | 0.006 | 0.007 | 0.008 |
| 7 | 3.31 | 3.30 | 3.28 | 3.28 | 3.28 |
|  | 0.005 | 0.005 | 0.006 | 0.007 | 0.007 |
| 8 | 3.29 | 3.28 | 3.26 | 3.26 | 3.26 |
|  | 0.005 | 0.006 | 0.006 | 0.006 | 0.007 |
| 9 | 3.30 | 3.30 | 3.29 | 3.26 | 3.26 |
|  | 0.005 | 0.006 | 0.007 | 0.007 | 0.007 |
| 10 | 3.23 | 3.23 | 3.22 | 3.22 | 3.20 |
|  | 0.002 | 0.002 | 0.003 | 0.003 | 0.003 |
| 11 | 2.44 | 2.44 | 2.43 | 2.42 | 2.41 |
|  | 0.001 | 0.001 | 0.001 | 0.001 | 0.001 |
| 12 | 3.65 | 3.65 | 3.61 | 3.60 | 3.58 |
|  | 0.005 | 0.006 | 0.006 | 0.007 | 0.007 |
| 13 | 3.41 | 3.41 | 3.38 | 3.36 | 3.35 |
|  | 0.009 | 0.009 | 0.009 | 0.009 | 0.009 |
| 14 | 3.23 | 3.22 | 3.20 | 3.18 | 3.18 |
|  | 0.001 | 0.001 | 0.001 | 0.001 | 0.001 |

TABLE 4-1-continued (Upper row: Dielectric constant
Lower row: Dielectric loss tangent)

| Example No. | 1 MHz | 10 MHz | 1 GHz | 10 GHz | 20 GHz |
|---|---|---|---|---|---|
| 15 | 3.10 | 3.10 | 3.07 | 3.07 | 3.04 |
|  | 0.003 | 0.003 | 0.003 | 0.004 | 0.004 |
| 16 | 3.52 | 3.52 | 3.50 | 3.50 | 3.48 |
|  | 0.004 | 0.004 | 0.004 | 0.004 | 0.006 |
| 17 | 3.61 | 3.60 | 3.58 | 3.55 | 3.55 |
|  | 0.008 | 0.008 | 0.008 | 0.009 | 0.009 |

TABLE 4-2

(Upper row: Dielectric constant
Lower row: Dielectric loss tangent)

| Example No. | 1 MHz | 10 MHz | 1 GHz | 10 GHz | 20 GHz |
|---|---|---|---|---|---|
| 18 | 3.15 | 3.14 | 3.10 | 3.10 | 3.10 |
|  | 0.003 | 0.004 | 0.005 | 0.005 | 0.006 |
| 19 | 3.19 | 3.18 | 3.12 | 3.12 | 3.11 |
|  | 0.003 | 0.004 | 0.005 | 0.006 | 0.006 |
| 20 | 3.20 | 3.19 | 3.15 | 3.14 | 3.13 |
|  | 0.004 | 0.004 | 0.005 | 0.005 | 0.006 |
| 21 | 3.25 | 3.24 | 3.24 | 3.22 | 3.20 |
|  | 0.003 | 0.003 | 0.004 | 0.005 | 0.005 |
| 22 | 3.21 | 3.20 | 3.17 | 3.15 | 3.13 |
|  | 0.003 | 0.004 | 0.004 | 0.005 | 0.005 |
| 23 | 3.20 | 3.20 | 3.15 | 3.15 | 3.14 |
|  | 0.003 | 0.003 | 0.004 | 0.005 | 0.006 |
| 24 | 3.20 | 3.19 | 3.18 | 3.14 | 3.14 |
|  | 0.003 | 0.004 | 0.005 | 0.005 | 0.006 |
| 25 | 3.21 | 3.20 | 3.17 | 3.15 | 3.15 |
|  | 0.004 | 0.004 | 0.005 | 0.006 | 0.006 |
| 26 | 3.20 | 3.20 | 3.19 | 3.16 | 3.13 |
|  | 0.003 | 0.004 | 0.005 | 0.006 | 0.007 |
| 27 | 3.21 | 3.19 | 3.17 | 3.16 | 3.15 |
|  | 0.003 | 0.004 | 0.004 | 0.005 | 0.006 |
| 28 | 2.92 | 2.90 | 2.89 | 2.88 | 2.86 |
|  | 0.001 | 0.001 | 0.002 | 0.002 | 0.002 |
| 29 | 3.62 | 3.61 | 3.60 | 3.58 | 3.56 |
|  | 0.005 | 0.005 | 0.006 | 0.006 | 0.007 |
| 30 | 3.34 | 3.34 | 3.32 | 3.31 | 3.30 |
|  | 0.007 | 0.008 | 0.008 | 0.009 | 0.009 |
| 31 | 3.21 | 3.19 | 3.18 | 3.17 | 3.17 |
|  | 0.001 | 0.001 | 0.001 | 0.001 | 0.001 |
| 32 | 3.08 | 3.06 | 3.04 | 3.02 | 3.01 |
|  | 0.002 | 0.002 | 0.003 | 0.003 | 0.003 |
| 33 | 3.49 | 3.48 | 3.46 | 3.45 | 3.44 |
|  | 0.004 | 0.004 | 0.005 | 0.005 | 0.005 |
| 34 | 3.59 | 3.58 | 3.58 | 3.58 | 3.58 |
|  | 0.007 | 0.007 | 0.007 | 0.005 | 0.004 |
| 35 | 2.88 | 2.87 | 2.86 | 2.86 | 2.85 |
|  | 0.001 | 0.001 | 0.001 | 0.001 | 0.001 |
| 36 | 2.89 | 2.89 | 2.87 | 2.85 | 2.84 |
|  | 0.001 | 0.001 | 0.002 | 0.002 | 0.002 |
| 37 | 2.98 | 2.97 | 2.95 | 2.94 | 2.93 |
|  | 0.002 | 0.002 | 0.003 | 0.003 | 0.003 |
| 38 | 2.68 | 2.67 | 2.65 | 2.64 | 2.64 |
|  | 0.002 | 0.001 | 0.002 | 0.002 | 0.002 |
| 39 | 2.65 | 2.64 | 2.62 | 2.61 | 2.60 |
|  | 0.002 | 0.002 | 0.002 | 0.002 | 0.003 |

TABLE 4-3

(Upper row: Dielectric constant
Lower row: Dielectric loss tangent)

| Example No. | 1 MHz | 10 MHz | 1 GHz | 10 GHz | 20 GHz |
|---|---|---|---|---|---|
| 40 | 2.56 | 2.54 | 2.49 | 2.48 | 2.48 |
|  | 0.003 | 0.003 | 0.004 | 0.004 | 0.005 |
| 41 | 2.69 | 2.69 | 2.67 | 2.67 | 2.67 |
|  | 0.004 | 0.004 | 0.005 | 0.005 | 0.005 |
| 42 | 2.89 | 2.86 | 2.86 | 2.85 | 2.82 |
|  | 0.006 | 0.006 | 0.006 | 0.006 | 0.007 |
| 43 | 3.01 | 3.00 | 3.00 | 3.00 | 3.00 |
|  | 0.006 | 0.007 | 0.007 | 0.007 | 0.007 |

TABLE 4-4

(Upper row: Dielectric constant
Lower row: Dielectric loss tangent)

| Example No. | 1 MHz | 10 MHz | 1 GHz | 10 GHz | 20 GHz |
|---|---|---|---|---|---|
| 44 | 3.01 | 3.00 | 2.97 | 2.96 | 2.95 |
|  | 0.003 | 0.003 | 0.003 | 0.003 | 0.003 |
| 45 | 3.02 | 3.01 | 2.99 | 2.99 | 2.98 |
|  | 0.003 | 0.004 | 0.004 | 0.004 | 0.004 |
| 46 | 2.98 | 2.97 | 2.95 | 2.94 | 2.93 |
|  | 0.003 | 0.003 | 0.003 | 0.004 | 0.004 |
| 47 | 2.99 | 2.98 | 2.97 | 2.96 | 2.96 |
|  | 0.004 | 0.005 | 0.005 | 0.005 | 0.006 |
| 48 | 2.98 | 2.97 | 2.95 | 2.95 | 2.94 |
|  | 0.005 | 0.006 | 0.007 | 0.007 | 0.007 |
| 49 | 2.82 | 2.81 | 2.79 | 2.78 | 2.77 |
|  | 0.003 | 0.003 | 0.003 | 0.004 | 0.005 |
| 50 | 2.99 | 2.98 | 2.97 | 2.96 | 2.96 |
|  | 0.003 | 0.003 | 0.004 | 0.004 | 0.005 |
| 51 | 2.79 | 2.78 | 2.76 | 2.76 | 2.75 |
|  | 0.002 | 0.002 | 0.002 | 0.002 | 0.002 |
| 52 | 2.85 | 2.84 | 2.85 | 2.83 | 2.83 |
|  | 0.002 | 0.002 | 0.002 | 0.003 | 0.003 |
| 53 | 2.85 | 2.84 | 2.82 | 2.81 | 2.79 |
|  | 0.001 | 0.001 | 0.002 | 0.002 | 0.002 |
| 54 | 2.92 | 2.91 | 2.89 | 2.87 | 2.86 |
|  | 0.003 | 0.003 | 0.003 | 0.004 | 0.004 |

COMPARATIVE EXAMPLES 1–14

<Preparation of Resin Compositions to be Plated>

Thermoplastic resins and inorganic fillers were pre-blended in the proportions shown in Table 5. The mixtures were fed into a biaxial extruder (ZE40™, manufactured by Hermann Berstorff Maschinenban GmbH) using a quantitative feeder at a rate of 40–60 kg/hour, and melt-kneaded at the temperatures and rotations shown in Table 6. After cooling with water, the strands were cut by a pelletizer to produce pellets.

<Molding>

The pellets were molded in the same manner as in Examples 1–54 except for those items listed in Table 6, thereby preparing test leaves for the evaluation of plating characteristics and electrical characteristics.

<Plating, Evaluation of Plating Characteristics, and Evaluation of Electrical Characteristics>

The same procedures as in Examples 1–54 were followed in principle, except that for the chemical etching conventional solvents were used under the conventionally reported conditions (temperatures and reaction time) shown in Table 7.

The results of evaluation of surface layer peelability and plating characteristics after chemical etching are shown together in Table 7 and the results of evaluation of electrical characteristics are shown in Table 8.

TABLE 5

| Comparative Example No. | Resin Types | Resin Amount (wt %) | Inorganic Filler Amount (wt %) | Inorganic Filler Average Diameter (μm) | Inorganic Filler Aspect Ratio (Average) |
|---|---|---|---|---|---|
| 1 | PEI | 50 | Glass fiber | | |
| | | | 50 | — | 80 |
| 2 | PEI | 50 | Calcium pyrophosphate | | |
| | | | 50 | 10 | 1.2 |
| 3 | PEI | 50 | Calcium carbonate | | |
| | | | 50 | 8 | 1.3 |
| 4 | PEI | 50 | Barium sulfate | | |
| | | | 50 | 5 | 1.4 |
| 5 | PEI | 50 | Glass beads | | |
| | | | 50 | 10 | 1.1 |
| 6 | PEI | 50 | Aluminum oxide | | |
| | | | 50 | 15 | 1.3 |
| 7 | LCP | 50 | Calcium pyrophosphate | | |
| | | | 50 | 10 | 1.2 |
| 8 | PPE | 50 | Calcium carbonate | | |
| | | | 50 | 8 | 1.3 |
| 9 | PPE | 50 | Calcium pyrophosphate | | |
| | | | 50 | 10 | 1.2 |
| 10 | PA | 50 | Calcium pyrophosphate | | |
| | | | 50 | 10 | 1.2 |
| 11 | PEI/PPE | 25/25 | Calcium pyrophosphate | | |
| | | | 50 | 10 | 1.2 |
| 12 | PEI/PPE | 30/20 | Calcium pyrophosphate | | |
| | | | 50 | 10 | 1.2 |
| 13 | PEI/PPE/LCP | 20/20/10 | Calcium pyrophosphate | | |
| | | | 50 | 10 | 1.2 |
| 14 | PA/PPE | 25/25 | Calcium pyrophosphate | | |
| | | | 50 | 10 | 1.2 |

TABLE 6

| Comparative Example No. | Kneading Conditions Temperature (°C.) | Kneading Conditions Rotation rpm | Injection Nozzle Temperature (°C.) |
|---|---|---|---|
| 1 | 320 | 100 | 340 |
| 2 | 320 | 100 | 340 |
| 3 | 320 | 100 | 340 |
| 4 | 320 | 100 | 340 |
| 5 | 320 | 100 | 330 |
| 6 | 320 | 100 | 340 |
| 7 | 330 | 100 | 340 |
| 8 | 290 | 150 | 300 |
| 9 | 290 | 150 | 300 |
| 10 | 250 | 150 | 250 |
| 11 | 300 | 100 | 330 |
| 12 | 300 | 100 | 330 |
| 13 | 310 | 100 | 330 |
| 14 | 290 | 100 | 300 |

TABLE 7

| Comp. Example No. | Chemical Etching Conditions Soln. | Chemical Etching Conditions Conc. | Chemical Etching Conditions Temp. (°C.) | Chemical Etching Conditions Time (min) | Surface Peelability | Evaluation of plated film Appearance Uniformity | Evaluation of plated film Appearance Swelling | Adhesion (Kg/cm) |
|---|---|---|---|---|---|---|---|---|
| 1 | Acq. NaOH | 10N | 80 | 120 | x | x | x | 0.23 |
| 2 | Conc. H$_2$SO$_4$ | | 25 | 15 | ⊙ | ⊙ | ⊙ | 1.85 |
| 3 | Conc. H$_2$SO$_4$ | | 25 | 15 | ○ | ○ | ○ | 1.46 |
| 4 | Conc. H$_2$SO$_4$ | | 25 | 15 | ○ | ○ | ○ | 1.50 |
| 5 | Acq. NaOH | 10N | 80 | 120 | Δ | ○ | ○ | 1.30 |
| 6 | Acq. NaOH | 10N | 80 | 120 | ○ | ○ | ○ | 1.19 |
| 7 | Conc. H$_2$SO$_4$ | | 25 | 15 | ⊙ | ⊙ | ⊙ | 1.86 |
| 8 | Conc. H$_2$SO$_4$ | | 25 | 15 | Δ | ○ | ○ | 1.10 |
| 9 | Conc. H$_2$SO$_4$ | | 25 | 15 | ○ | ○ | ○ | 1.26 |
| 10 | Conc. H$_2$SO$_4$ | | 25 | 15 | ⊙ | ⊙ | ⊙ | 1.36 |
| 11 | Conc. H$_2$SO$_4$ | | 25 | 15 | ⊙ | ⊙ | ⊙ | 1.45 |
| 12 | Conc. H$_2$SO$_4$ | | 25 | 15 | ⊙ | ⊙ | ⊙ | 1.65 |
| 13 | Conc. H$_2$SO$_4$ | | 25 | 15 | ⊙ | ⊙ | ⊙ | 1.80 |
| 14 | Conc. H$_2$SO$_4$ | | 25 | 15 | ⊙ | ⊙ | ⊙ | 1.47 |

TABLE 8

(Upper row: Dielectric constant
Lower row: Dielectric loss tangent)

| Comparative Example No. | 1 MHz | 10 MHz | 1 GHz | 10 GHz | 20 GHz |
|---|---|---|---|---|---|
| 1 | 4.51 | 4.44 | 4.41 | 4.40 | 4.28 |
|   | 0.032 | 0.033 | 0.035 | 0.039 | 0.042 |
| 2 | 4.48 | 4.42 | 4.36 | 4.35 | 4.35 |
|   | 0.028 | 0.028 | 0.029 | 0.030 | 0.033 |
| 3 | 3.99 | 3.97 | 3.96 | 3.96 | 3.95 |
|   | 0.015 | 0.015 | 0.016 | 0.016 | 0.018 |
| 4 | 4.15 | 4.14 | 4.10 | 4.10 | 4.09 |
|   | 0.019 | 0.018 | 0.022 | 0.021 | 0.021 |
| 5 | 4.49 | 4.43 | 4.42 | 4.41 | 4.35 |
|   | 0.035 | 0.034 | 0.036 | 0.036 | 0.036 |
| 6 | 4.20 | 4.20 | 4.18 | 4.18 | 4.15 |
|   | 0.022 | 0.022 | 0.024 | 0.025 | 0.025 |
| 7 | 4.69 | 4.67 | 4.65 | 4.61 | 4.60 |
|   | 0.033 | 0.034 | 0.035 | 0.035 | 0.038 |
| 8 | 4.15 | 4.15 | 4.14 | 4.12 | 4.12 |
|   | 0.018 | 0.018 | 0.020 | 0.021 | 0.024 |
| 9 | 4.28 | 4.26 | 4.25 | 4.25 | 4.24 |
|   | 0.009 | 0.010 | 0.012 | 0.012 | 0.013 |
| 10 | 4.59 | 4.58 | 4.52 | 4.50 | 4.48 |
|   | 0.033 | 0.033 | 0.032 | 0.034 | 0.035 |
| 11 | 4.39 | 4.38 | 4.35 | 4.31 | 4.30 |
|   | 0.029 | 0.029 | 0.031 | 0.033 | 0.034 |
| 12 | 4.45 | 4.41 | 4.39 | 4.38 | 4.38 |
|   | 0.031 | 0.035 | 0.036 | 0.037 | 0.037 |
| 13 | 4.50 | 4.46 | 4.42 | 4.41 | 4.40 |
|   | 0.033 | 0.035 | 0.036 | 0.036 | 0.037 |
| 14 | 4.40 | 4.40 | 4.38 | 4.32 | 4.30 |
|   | 0.030 | 0.031 | 0.033 | 0.035 | 0.036 |

Evaluation and Comparison of Plating Characteristics

Samples of Examples 1–54 comprise commercially available resins, polymer alloys, and aluminum borate or amorphous silica with a specific size and shape. Samples of Comparative Examples 1–14 were made by blending conventional inorganic fillers.

Although the required plate adhesion strength differs depending on the application, the strength should be at least about 1 kg/cm. As can be seen in Tables 3-1 to 3-4, no test leaves of Examples 1–54 were peeled in the surface peelability test after etching with alkali (a KOH aqueous solution). In addition, all these test leaves exhibited an adhesion strength greater than 1 kg/cm.

As can be seen in Tables 5 and 7, the composition of the Comparative Example 1 blended with glass fiber exhibited peeling of the surface layer after chemical etching, indicating poor plating strength. The external appearance of the plated surface was also poor. On the other hand, Tables 5 and 7 show that all test leaves of the Comparative Examples 2–14 exhibited adequate plating characteristics. There was no peeling in the surface peelability test after chemical etching and all these test leaves exhibited an adhesion strength greater than 1 kg/cm.

Evaluation and Comparison of Electrical Characteristics

As indicated in Tables 4-1 to 4-4, test leaves made from compositions of Examples 1–54 comprising aluminum borate or amorphous silica had a dielectric constant of 4.0 or less at all wavelengths. Some exhibited a dielectric constant of 3.0 or less. In addition, all these test leaves had a dielectric loss tangent of 0.01 or less, showing superior electrical characteristics of the resin composition of the present invention comprising aluminum borate or amorphous silica.

In contrast, as can be seen in Table 8, all test leaves of the Comparative Examples 1–14 exhibited both a high dielectric constant and a high dielectric loss tangent, indicating remarkably impaired electrical characteristics for these test leaves as compared with those of the present invention.

As illustrated above, the resin composition for plating of the present invention has both excellent plating characteristics and excellent electrical characteristics. The composition is useful as a material for electric and electronic parts used in high frequency ranges.

Obviously, numerous modifications and variations of the present invention are possible in light of the above teachings. It is therefore to be understood that, within the scope of the appended claims, the invention may be practiced otherwise than as specifically described herein.

What is claimed is:

1. A method of forming a structure of a microporous resin bonded to metal, comprising:

molding a resin composition comprising a polymer alloy consisting of polyether imide and polyphenylene ether and particles of aluminum borate or amorphous silica filler, wherein the particles of aluminum borate and amorphous silica have an aspect ratio of 10 or less and an average diameter of 0.01–100 $\mu$m, the aluminum borate having the formula: $nAl_2O_3 \cdot mB_2O_3$, wherein n and m individually represent an integer of 1–100, and the amorphous silica having the formula: $SiO_2$, into a shaped object;

treating the molded resin composition with an aqueous alkaline solution to remove said filler, thereby creating micropores within the resin object; and depositing a metal film on a surface of said treated resin object.

2. The method of claim 1 containing 5–70 wt % of the inorganic filler.

3. The method of claim 1, wherein the aqueous alkaline solution ranges from 1 to 15 normal.

4. The method of claim 1, wherein the molded resin is treated with an aqueous alkaline solution at a temperature of 20° C. to 120° C.

5. The method of claim 1, wherein said molded object is prepared by injection molding or extrusion molding of said filled polymer alloy.

6. The method of claim 1, wherein the amorphous silica has an $SiO_2$ purity of 96% or more.

* * * * *